(12) United States Patent
Penta et al.

(10) Patent No.: US 8,795,548 B1
(45) Date of Patent: *Aug. 5, 2014

(54) SILICON WAFER POLISHING COMPOSITION AND RELATED METHODS

(71) Applicant: Rohm and Haas Electronic Materials CMP Holdings, Inc., Newark, DE (US)

(72) Inventors: Naresh Kumar Penta, Newark, DE (US); Lee Melbourne Cook, Steelville, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/860,806

(22) Filed: Apr. 11, 2013

(51) Int. Cl.
*C09K 13/00* (2006.01)
*C09G 1/04* (2006.01)
*H01L 21/306* (2006.01)

(52) U.S. Cl.
CPC ............ *C09G 1/04* (2013.01); *H01L 21/30625* (2013.01)
USPC ....................................................... 252/79.1

(58) Field of Classification Search
USPC ........................................... 252/79.1; 216/88
See application file for complete search history.

(56) References Cited

U.S. PATENT DOCUMENTS

| 5,860,848 | A | 1/1999 | Loncki et al. |
| 8,147,295 | B2 | 4/2012 | Katoh et al. |
| 2012/0295443 | A1 | 11/2012 | Morinaga et al. |

FOREIGN PATENT DOCUMENTS

| WO | 2012105651 | 8/2012 |

OTHER PUBLICATIONS

Copending U.S. Appl. No. 13/860,830.

*Primary Examiner* — Roberts Culbert
(74) *Attorney, Agent, or Firm* — Thomas S. Deibert

(57) ABSTRACT

A chemical mechanical polishing composition for polishing silicon wafers is provided, containing: water; a cation according to formula (I); piperazine or a piperazine derivative according to formula (II); and, optionally, a pH adjusting agent; wherein the polishing composition exhibits a silicon removal rate of at least 300 nm/min. Also provided are methods of making and using the chemical mechanical polishing composition.

10 Claims, No Drawings

SILICON WAFER POLISHING COMPOSITION AND RELATED METHODS

The present invention relates generally to the field of chemical mechanical polishing. In particular, the present invention is directed to a chemical mechanical polishing composition and method for chemical mechanical polishing of silicon wafers.

Silicon wafers for use in the semiconductor industry typically require a very high degree of surface perfection before they can be utilized in device manufacture. The silicon wafer surfaces are produced by chemical mechanical polishing of the wafer surfaces with a polishing slurry. Polishing slurries conventionally consist of a composition that includes a concentration of submicron abrasive particles. The silicon wafer is bathed or rinsed in the polishing slurry in combination with a polishing pad which is pressed against the surface of the silicon wafer and rotated such that the abrasive particles in the polishing slurry are pressed against the surface of the silicon wafer under a load. The lateral motion of the polishing pad causes the abrasive particles in the polishing slurry to move across the silicon wafer surface, resulting in wear, or volumetric removal of the material from the surface of the silicon wafer. Ideally, this process results in the selective removal of projecting surface features so that when the process is finished a perfectly planar surface is produced down to the finest level of detail.

The silicon polishing process that are conventionally practiced in the industry consist of two or more steps. In the first polish step, (i.e., coarse polish step) gross defects remaining from wafer sawing and shaping operations are removed. The wafer surface appears smooth and specular following the first polish step, but still contains numerous minute defects. These minute defects are removed by a subsequent final polish step that removes a small amount of material from the surface, but act to polish away the surface defects. The present invention relates to solutions which are particularly useful for the first polish step through the final polish step.

The number and permissible size of any surface imperfections on the silicon wafer surface remaining after polishing is continually decreasing. Some of the most critical material specifications for silicon wafers are: the surface metals content, the front surface micro roughness and the total particle per unit area.

One polishing composition for final polishing silicon wafers is disclosed in U.S. Pat. No. 5,860,848 to Loncki et al. Loncki et al. disclose a polishing composition comprising: water, submicron silica particles at 0.02 to 0.5 percent by weight in said composition, a salt at a concentration of 100 to 1,000 ppm, an amine compound at a concentration sufficient to effect a composition pH of 8 to 11, and a polyelectrolyte dispersion agent at a concentration of 20 to 500 ppm, wherein said composition has a total sodium and potassium content below about 1 ppm, and an iron, nickel, and copper content each below about 0.1 ppm, all ppm being parts per million by weight of said composition.

There nevertheless remains a need for new chemical mechanical polishing compositions for final polishing silicon wafers. Particularly, there is a need for new chemical mechanical polishing compositions for stock silicon wafer polishing (i.e., first step) through the final polishing of the silicon wafers which exhibit a silicon removal rate of ≥300 nm/min.

The present invention provides a chemical mechanical polishing composition for polishing a silicon wafer, comprising: water; a cation according to formula (I):

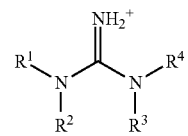

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

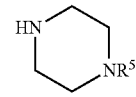

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, optionally, a pH adjusting agent; wherein the polishing composition exhibits a silicon removal rate of at least 300 mm/min.

The present invention provides a chemical mechanical polishing composition for polishing a silicon wafer, comprising: water; a cation according to formula (I):

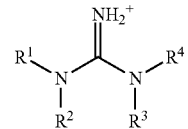

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, piperazine or a piperazine derivative according to formula (II)

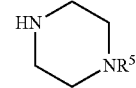

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and, optionally, a pH adjusting agent; wherein the polishing composition exhibits a silicon removal rate of at least 300 nm/min; and, wherein the polishing composition contains <1 ppm of polymers.

The present invention provides a chemical mechanical polishing composition for polishing a silicon wafer, comprising: water; a cation according to formula (I):

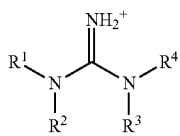
(I)

wherein $R^1$, $R^2$, $R^3$, $R^4$ are each a hydrogen; and, piperazine or a piperazine derivative according to formula (II)

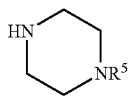
(II)

wherein $R^5$ is a hydrogen; and, optionally, a pH adjusting agent; wherein the polishing composition exhibits a silicon removal rate of at least 300 nm/min.

The present invention provides a chemical mechanical polishing composition for polishing a silicon wafer, comprising: water; a cation according to formula (I):

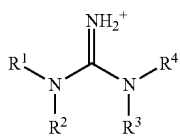
(I)

wherein $R^1$, $R^2$, $R^3$, $R^4$ are each a hydrogen; and, piperazine or a piperazine derivative according to formula (II)

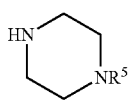
(II)

wherein $R^5$ is a hydrogen; and, optionally, a pH adjusting agent; wherein the polishing composition exhibits a silicon removal rate of at least 300 nm/min; and, wherein the polishing composition contains <1 ppm of polymers.

The present invention provides a method of making the chemical mechanical polishing composition of the present invention, comprising: providing a water; providing a source of cations according to formula (I)

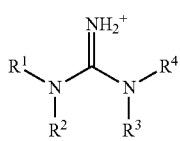
(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and, providing a source of piperazine or a piperazine derivative according to formula (II)

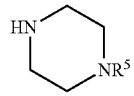
(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; optionally, providing a pH adjusting agent; and, combining the water, the source of cations according to formula (I), the source of piperazine or piperazine derivative according to formula (II) and the optional pH adjusting agent; wherein the chemical mechanical polishing composition exhibits a pH of 8 to 12.

The present invention provides a method of polishing a silicon wafer, comprising: providing a silicon wafer; providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa; and dispensing the chemical mechanical polishing composition onto the chemical mechanical polishing pad at or near the interface between the chemical mechanical polishing pad and the silicon wafer; wherein the chemical mechanical polishing composition has a pH of 8 to 11.

The present invention provides a method of polishing a silicon wafer, comprising: providing a silicon wafer; providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force; and, dispensing the chemical mechanical polishing composition onto the chemical mechanical polishing pad at or near the interface between the chemical mechanical polishing pad and the silicon wafer; wherein the chemical mechanical polishing composition has a pH of 8 to 11; wherein the chemical mechanical polishing composition exhibits a silicon removal rate of at least 300 nm/min with a platen speed of 63 revolutions per minute, a carrier speed of 57 revolutions per minute, a chemical mechanical polishing composition flow rate of 200 ml/min, and a down force of 27.58 kPa (4 psi) on a 200 mm polishing machine where the chemical mechanical polishing pad comprises a polyurethane impregnated, non-woven polyester felt pad.

DETAILED DESCRIPTION

The chemical mechanical polishing composition of the present invention is useful for polishing silicon wafers. The chemical mechanical polishing composition of the present invention preferably contains a silicon removal rate enhancing, synergistic, combination of (i) a cation according to formula (I); and, (ii) piperazine or a piperazine derivative according to formula (II).

Preferably, the chemical mechanical polishing composition of the present invention is abrasive free.

The water contained in the chemical mechanical polishing composition of the present invention, is preferably at least one of deionized and distilled to limit incidental impurities.

Preferably, the chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of a cation according to formula (I)

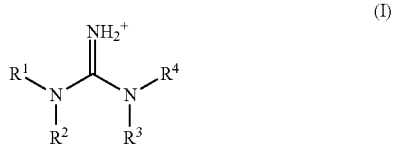

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the chemical mechanical polishing composition of the present invention contains 0.0005 to 10 wt % (more preferably, 0.005 to 1 wt %; still more preferably, 0.01 to 0.5 wt %; most preferably, 0.04 to 0.06 wt %) of a cation according to formula (I), wherein the cation according to formula (I) is according to formula (Ia)

Preferably, the chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of piperazine or a piperazine derivative according to formula (II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group). Most preferably, the chemical mechanical polishing composition of the present invention contains 0.0005 to 10 moles/L (more preferably, 0.005 to 1 moles/L; still more preferably, 0.01 to 0.5 moles/L; most preferably, 0.04 to 0.06 moles/L) of piperazine.

The chemical mechanical polishing composition of the present invention provides efficacy over a pH of 8 to 12. Preferably, the chemical mechanical polishing composition of the present invention exhibits a pH of 8 to 12 (more preferably, 9 to 11; still more preferably, 9.5 to 11.5; most preferably 10). To achieve the desired pH, the chemical mechanical polishing composition of the present invention may optionally contain a pH adjusting agent. Preferably, the pH adjusting agent is an inorganic pH adjusting agent. Preferred inorganic pH adjusting agents including inorganic acids and bases. Preferred inorganic acid pH adjusting agents are selected from phosphoric acid, nitric acid, sulfuric acid and hydrochloric acid (most preferably, nitric acid). Preferred inorganic base pH adjusting agents are selected from ammonium hydroxide and potassium hydroxide (most preferably, potassium hydroxide).

The chemical mechanical polishing composition of the present invention preferably further comprises ions selected from the group consisting of carbonate ions; phosphate ions and halide ions. More preferably, the chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of ions selected from the group consisting of carbonate ions; phosphate ions and halide ions. Still more preferably, the chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of ions selected from the group consisting of carbonate ions and phosphate ions. Most preferably, the chemical mechanical polishing composition of the present invention contains 0.00025 to 5 moles/L (more preferably, 0.0025 to 0.5 moles/L; still more preferably, 0.005 to 0.25 moles/L; most preferably, 0.02 to 0.03 moles/L) of carbonate ions.

The chemical mechanical polishing composition of the present invention preferably further comprises halide ions (preferably, chloride ions). More preferably, the chemical mechanical polishing 0.0001 to 4 wt % (more preferably, 0.001 to 0.5 wt %; still more preferably, 0.003 to 0.2 wt %; most preferably, 0.01 to 0.03 wt %) of halide ions (preferably, chloride ions).

The chemical mechanical polishing composition of the present invention preferably contains <1 ppm (more preferably, <0.1 ppm; still more preferably, <0.01 ppm) of polymers. Most preferably, the chemical mechanical polishing composition of the present invention is free of polymers (e.g., water soluble polymers, such as cellulose based polymers; and polyelectrolytes, such as hydroxyethyl cellulose, polyvinyl alcohol, polyacrylamide, polyvinyl pyrrolidone, polyethylene glycol, polypropylene glycol, polyethylene oxide, polyacrylic acid).

The method of making the chemical mechanical polishing composition of the present invention, preferably comprises: providing a water (preferably, a water that is at least one of deionized and distilled; more preferably, a water that is both deionized and distilled); providing a source of cations according to formula (I)

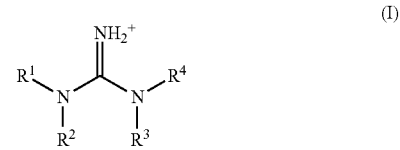

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen (i.e., wherein the anion is

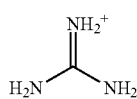

)); and, providing a source of piperazine or a piperazine derivative according to formula (II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group (preferably, a hydrogen, a $C_{1-10}$ alkyl group, a $C_6$ aryl group and a $C_7$ alkylaryl group; more preferably, a hydrogen, a methyl group and a phenyl group; most preferably, a hydrogen); optionally, providing a pH adjusting agent; and, combining the water, the source of cations according to formula (I), the source of piperazine or piperazine derivative according to formula (II) and the optional pH adjusting agent; wherein the chemical mechanical polishing composition exhibits a pH of 8 to 12 (preferably 9 to 11; more preferably 9.5 to 10.5; most preferably 10). Preferably, in the method of making the chemical mechanical polishing composition of the present invention, the source of cations according to formula (I) is selected from the group consisting of guanidine carbonate (i.e., $(H_2NC(=NH)NH_2)_2 \cdot H_2CO_3$); guanidine phosphate (i.e., $(H_2NC(=NH)NH_2)_2 \cdot H_3PO_4$); and guanidine hydrochloride (i.e., $H_2NC(=NH)NH_2 \cdot HCl$). Preferably, in the method of making the chemical mechanical polishing composition of the present invention, the source of cations according to formula (I) is selected from the group consisting of guanidine carbonate (i.e., $(H_2NC(=NH)NH_2)_2 \cdot H_2CO_3$); and, guanidine phosphate (i.e., $(H_2NC(=NH)NH_2)_2 \cdot H_3PO_4$). Preferably, in the method of making the chemical mechanical polishing composition of the present invention, the source of piperazine or piperazine derivative according to formula (II) is piperazine dihydrochloride hydrate.

The method of polishing a silicon wafer of the present invention preferably comprises: providing a silicon wafer; providing a chemical mechanical polishing composition according to the present invention; providing a chemical mechanical polishing pad; providing a polishing machine; installing the silicon wafer and the chemical mechanical polishing pad in the polishing machine; creating dynamic contact at an interface between the chemical mechanical polishing pad and the silicon wafer with a down force of ≥0.5 kPa (preferably 0.5 to 100 kPa; more preferably, 0.7 to 50 kPa; still more preferably, 6 to 35 kPa; most preferably, 20 to 30 kPa); and dispensing the chemical mechanical polishing composition onto the chemical mechanical polishing pad at or near the interface between the chemical mechanical polishing pad and the silicon wafer; wherein the chemical mechanical polishing composition has a pH of 8 to 12 (preferably, 9 to 11; more preferably 9.5 to 10.5; most preferably 10). Preferably, the chemical mechanical polishing composition used in the method of the present invention exhibits a silicon removal rate of at least 300 nm/min (more preferably, at least 400 nm/min; most preferably, at least 500 nm/min) with a platen speed of 63 revolutions per minute, a carrier speed of 57 revolutions per minute, a chemical mechanical polishing composition flow rate of 200 ml/min, and a nominal down force of 27.58 kPa (4 psi) on a 200 mm polishing machine, wherein the chemical mechanical polishing pad used comprises a polyurethane impregnated, non-woven polyester felt pad.

Some embodiments of the present invention will now be described in detail in the following Examples.

Comparative Examples C1-C18 and Examples 1-3

Chemical Mechanical Polishing Composition Preparation

The chemical mechanical polishing compositions used in the polishing Examples PC1-PC18 and P1-P3 (namely chemical mechanical polishing compositions C1-C18 and 1-3, respectively) were prepared by combining the components in the amounts listed in TABLE 1 and adjusting the pH of the compositions to the final pH listed in TABLE 1 with $HNO_3$ or KOH as required and as noted in TABLE 1.

TABLE 1

| Ex # | guanidine carbonate[¥] (Moles/L) | guanidine phosphate[ε] (Moles/L) | guanidine hydochloride[ε] (Moles/L) | piperazine hydrochloride hydrate[λ] (Moles/L) | pH adjusting agent | pH |
|---|---|---|---|---|---|---|
| C1 | 0.01 | 0 | 0 | 0 | HNO₃ | 10 |
| C2 | 0 | 0 | 0 | 0.01 | KOH | 10 |
| C3 | 0.05 | 0 | 0 | 0 | HNO₃ | 10 |
| C4 | 0 | 0 | 0 | 0.05 | KOH | 10 |
| C5 | 0.1 | 0 | 0 | 0 | HNO₃ | 10 |
| C6 | 0 | 0 | 0 | 0.1 | KOH | 10 |
| C7 | 0 | 0.01 | 0 | 0 | HNO₃ | 10 |
| C8 | 0 | 0.05 | 0 | 0 | HNO₃ | 10 |
| C9 | 0 | 0 | 0 | 0.01 | KOH | 10 |
| C10 | 0 | 0 | 0 | 0.05 | KOH | 10 |
| C11 | 0 | 0.005 | 0 | 0.005 | HNO₃ | 10 |
| C12 | 0 | 0.025 | 0 | 0.025 | HNO₃ | 10 |
| C13 | 0 | 0 | 0.01 | 0 | KOH | 10 |
| C14 | 0 | 0 | 0.05 | 0 | KOH | 10 |
| C15 | 0 | 0 | 0 | 0.01 | KOH | 10 |
| C16 | 0 | 0 | 0 | 0.05 | KOH | 10 |
| C17 | 0 | 0 | 0.005 | 0.005 | KOH | 10 |
| C18 | 0 | 0 | 0.025 | 0.025 | KOH | 10 |
| 1 | 0.005 | 0 | 0 | 0.005 | KOH | 10 |
| 2 | 0.025 | 0 | 0 | 0.025 | KOH | 10 |
| 3 | 0.05 | 0 | 0 | 0.05 | KOH | 10 |

[¥]guanidine carbonate (available from Sigma-Aldrich)
[ε]guanidine phosphate (available from Sigma-Aldrich)
[ε]guanidine hydrochloride (available from Sigma-Aldrich)
[λ]piperazine hydrochloride hydrate (available from Sigma-Aldrich)

Comparative PC1-PC18 and Examples P1-P3

Chemical Mechanical Polishing Experiments

Silicon removal rate polishing tests were performed using the chemical mechanical polishing compositions prepared according to Comparative Examples C1-C18 and Examples 1-3. Specifically, the silicon removal rate for each of the chemical mechanical polishing compositions C1-C18 and 1-3 identified in TABLE 1. These silicon removal rate experiments were performed using eight inch Si(100) wafers, which were pre-etched in a 0.5 wt % hydrofluoric acid solution for 90 seconds, using a Strasbaugh Model 6EC polisher and a Subal200™ a polyurethane impregnated, non-woven polyester felt pad (commercially available from Rohm and Haas Electronic Materials CMP Inc.) with a down force of 27.58 kPa (4 psi), a chemical mechanical polishing composition flow rate of 200 ml/min, a table rotation speed of 63 rpm and a carrier rotation speed of 57 rpm. The silicon removal rates were determined from a measurement of the weight loss from the individual Si(100) wafers from the polishing. The results of the silicon removal rate experiments are provided in TABLE 2.

TABLE 2

| Polish Example # | Polishing Composition | Si(100) removal rate (nm/min) |
|---|---|---|
| PC1 | C1 | 357 |
| PC2 | C2 | 377 |
| PC3 | C3 | 459 |
| PC4 | C4 | 425 |
| PC5 | C5 | 489 |
| PC6 | C6 | 461 |
| PC7 | C7 | 272 |
| PC8 | C8 | 375 |
| PC9 | C9 | 377 |
| PC10 | C10 | 425 |
| PC11 | C11 | 403 |
| PC12 | C12 | 484 |
| PC13 | C13 | 216 |
| PC14 | C14 | 301 |
| PC15 | C15 | 377 |
| PC16 | C16 | 425 |
| PC17 | C17 | 395 |
| PC18 | C18 | 478 |
| P1 | 1 | 404 |
| P2 | 2 | 481 |
| P3 | 3 | 504 |

We claim:

1. A chemical mechanical polishing composition for polishing a silicon wafer, comprising:
   water;
   a cation according to formula (I):

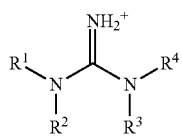

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
   piperazine or a piperazine derivative according to formula (II)

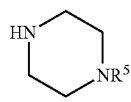

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group; and,
   optionally, a pH adjusting agent;
   wherein the polishing composition exhibits a silicon removal rate of at least 300 nm/min.

2. The chemical mechanical polishing composition of claim 1, wherein the chemical mechanical polishing composition contains <1 ppm of polymers.

3. The chemical mechanical polishing composition of claim 1, further comprising at least one of carbonate ions and phosphate ions.

4. The chemical mechanical polishing composition of claim 3, further comprising:
   halide ions.

5. A method of making the chemical mechanical polishing composition of claim 1, comprising:
   providing a water;
   providing a source of cations according to formula (I)

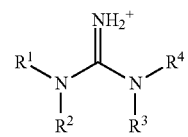

(I)

wherein $R^1$, $R^2$, $R^3$, $R^4$ are independently selected from the group consisting of a hydrogen and a $C_{1-10}$ alkyl group, a $C_{1-10}$ aryl group, a $C_{1-10}$ arylalkyl group and a $C_{1-10}$ alkylaryl group; and,
   providing a source of piperazine or a piperazine derivative according to formula (II)

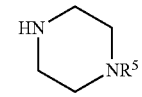

(II)

wherein $R^5$ is selected from the group consisting of a hydrogen, a $C_{1-10}$ alkyl group, a $C_{1-10}$ aryl group, a $C_{1-10}$ arylalkyl group and a $C_{1-10}$ alkylaryl group;
   optionally, providing a pH adjusting agent; and,
   combining the water, the source of cations according to formula (I), the source of piperazine or piperazine derivative according to formula (II) and the optional pH adjusting agent;
   wherein the chemical mechanical polishing composition exhibits a pH of 8 to 12.

6. The method of claim 5, wherein the source of cations according to formula (I) is selected from the group consisting of guanidine carbonate and guanidine phosphate.

7. The method of claim 5, wherein the source of piperazine or piperazine derivative according to formula (II) is piperazine dihydrochloride hydrate.

8. The method of claim 6, wherein the source of piperazine or piperazine derivative according to formula (II) is piperazine dihydrochloride hydrate.

9. A method of polishing a silicon wafer, comprising:
   providing a silicon wafer;
   providing a chemical mechanical polishing composition according to claim 1;
   providing a chemical mechanical polishing pad;
   providing a polishing machine;
   installing the silicon wafer and the chemical mechanical polishing pad in the polishing machine;
   creating dynamic contact at an interface between the chemical mechanical polishing pad and the silicon wafer with a down force of ≥0.5 kPa; and
   dispensing the chemical mechanical polishing composition onto the chemical mechanical polishing pad at or near the interface between the chemical mechanical polishing pad and the silicon wafer;

wherein the chemical mechanical polishing composition has a pH of 8 to 11.

10. The method of claim 9, wherein the chemical mechanical polishing composition exhibits a silicon removal rate of at least 300 nm/min with a platen speed of 63 revolutions per minute, a carrier speed of 57 revolutions per minute, a chemical mechanical polishing composition flow rate of 200 ml/min, and a down force of 27.58 kPa (4 psi) on a 200 mm polishing machine where the chemical mechanical polishing pad comprises a polyurethane impregnated, non-woven polyester felt pad.

\* \* \* \* \*